PLURAL CAVITY TUNER EMPLOYING VARIABLE CAPACITOR TUNING AND INDUCTIVE COUPLING

Filed Feb. 1, 1967 2 Sheets-Sheet 1

INVENTORS
Teruaki Arakawa
Ikuo Saito

BY Hill, Sherman, Meroni, Gross & Simpson ATTORNEYS

Fig. 5
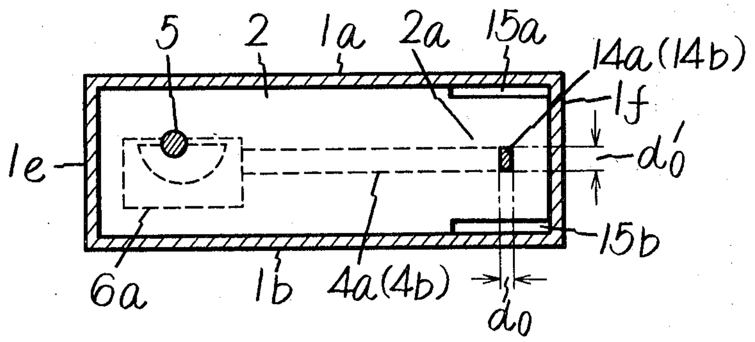
Fig. 6
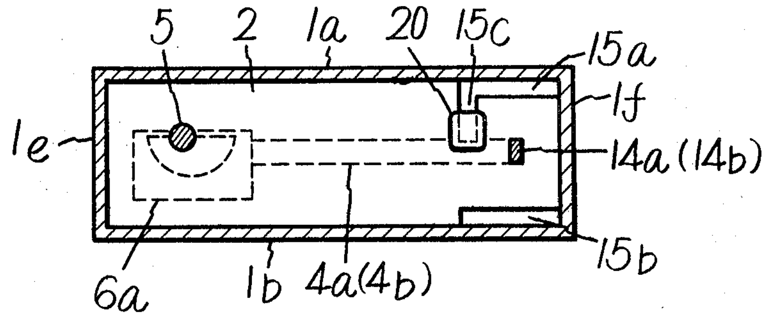
Fig. 7 Fig. 8 Fig. 9
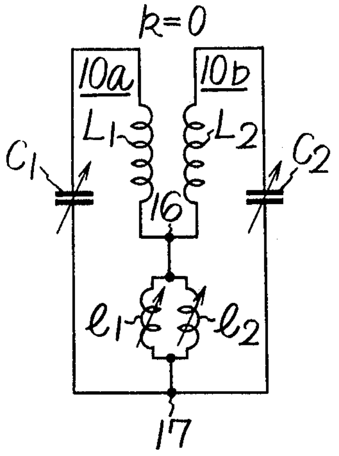
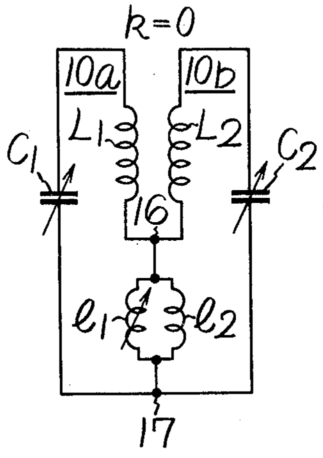
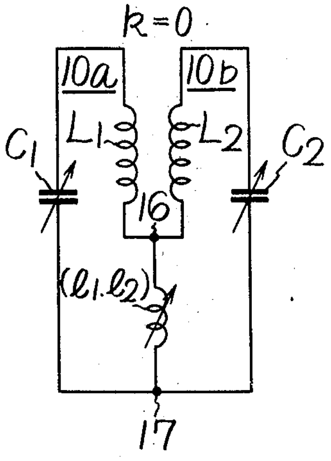
INVENTORS
Teruaki Arakawa
Ikuo Saito
BY Hill, Sherman, Meroni, Gross & Simpson ATTORNEYS United States Patent Office 3,517,353

Patented June 23, 1970

3,517,353

PLURAL CAVITY TUNER EMPLOYING VARIABLE CAPACITOR TUNING AND INDUCTIVE COUPLING

Teruaki Arakawa, 99 Seijo-machi, Setagaya-ku, Tokyo, Japan, and Ikuo Saito, 4–7 Goshozuka-1, Kawasaki-shi, Kanagawa-ken, Japan Filed Feb. 1, 1967, Ser. No. 613,263
Int. Cl. H03j 3/00, 3/28
U.S. Cl. 334—45 2 Claims

ABSTRACT OF THE DISCLOSURE

A UHF tuner device which constitutes an inductance element in cavity resonance. By the employment of inductance coupling selectivity of a tuner device is greatly improved which requires loose coupling for handling signals of narrow fractional band width such as television signals in the UHF band.

BACKGROUND OF THE INVENTION

Field of the invention

This invention relates to a tuner device for use with signals of UHF band, and more particularly to a tuner device which is simple in construction, excellent in frequency selectivity and hence is suitable for use with UHF television signals.

Description of the prior art

In conventional types of UHF tuner devices a conductive casing is partitioned by a conductive partition wall into a plurality of tuning cavities and a relatively large aperture is formed in the conductive partition wall, through which UHF waves are passed to thereby couple the tuning cavities mainly capacitively. However, the capacitive coupling exhibits a low degree of selectivity.

SUMMARY OF INVENTION

The principal object of this invention is to provide a UHF tuner device in which a plurality of cavities are interconnected with one another by inductance coupling to greatly improve selectivity of the tuner device in the UHF band.

Another object of this invention is to provide a UHF tuner device which is designed to make inductance coupling coefficient of cavities variable, by which the inductance coupling coefficient can be set at a desired value after a predetermined tuning is effected, to facilitate manufacturing of the tuner device.

Briefly stated, according to this invention a conductive partition wall is provided in a conductive casing to provide a plurality of cavities such for example as first and second cavities, and a variable capacitor and a conductor connected thereto at one end and functing as an inductance element are disposed in each cavity, thus constituting first and second variable tuners. Then, the other ends of the conductors are connected to the partition wall and the partition wall is cut off near the portion surrounding the connecting point of the conductors to form a slit, thus ensuring that the partition wall between the conductive casing and the connecting point of the conductors and the partition wall performs the function of a coupling inductance element between the first and second variable tuners. Accordingly, this invention is suitable for use in the tuner device of UHF television receivers.

Other objects, features and advantages of this invention will become apparent from the following description taken in conjunction with the accompanying drawings, in which:

BRIEF DESCRIPTION OF DRAWINGS

FIGS. 4 to 6, inclusive, are cross-sectional views, similar to FIG. 1, illustrating modified forms of the principal part of this invention;

FIG. 7 is an equivalent circuit of the example shown in FIG. 3; and

FIGS. 8 and 9 are equivalent circuits of the example depicted in FIG. 6.

DESCRIPTION OF THE PREFERRED EMBODIMENTS

Figure 1:
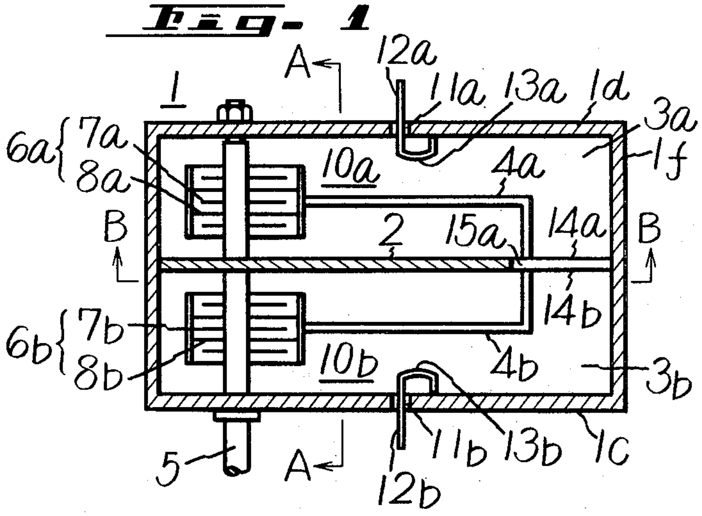
FIG. 1 is a top plan view, partly in cross-section, illustrating one example of a tuner device of this invention.
Figure 2:
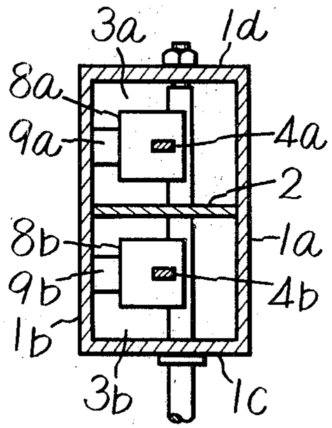
FIG. 2 is a cross-sectional view taken along the line A—A in FIG. 1.

The following will describe one example of the tuner device of this invention with reference to the drawings.

Reference numeral 1 indicates a casing of the tuner device, which consists of top, bottom, front, rear, left and right side plates 1*a*, 1*b*, 1*c*, 1*d*, 1*e* and 1*f* made of a conductive material. In parallel with the front plate 1*c* and the rear plate 1*d* a partition wall 2 made of a conductive material is provided in the casing 1, dividing it into two and providing first and second cavities 3*a* and 3*b*. Rod-like central conductors 4*a* and 4*b*, each constituting an inductance element, are disposed centrally of the cavities 3*a* and 3*b* in parallel with the top and bottom plate 1*a* and 1*b* and the partition wall 2. Meanwhile, a rotary shaft 5 extends between the front plate 1*c* and the rear plate 1*d* and is journalled therein adjacent the left side plate 1*e*. The rotary shaft 5 extends outwardly of the front plate 1*c*. Affixed to the rotary shaft 5 in the respective cavities are rotary discs 7*a* and 7*b* constituting respective elements of variable capacitors 6*a* and 6*b*. Fixed plates 8*a* and 8*b* of the variable capacitors 6*a* and 6*b* are secured respectively to insulators 9*a* and 9*b* attached to the bottom plate 1*b*. Each one end of the central conductors 4*a* and 4*b* is coupled respectively to the fixed plates 8*a* and 8*b* of the variable capacitors 6*a* and 6*b*. The central conductor 4*a* and the variable capacitor 6*a* constitute a first tuner 10*a*, while the central conductor 4*b* and the variable capacitor 6*b* constitute a second tuner 10*b*. The tuning frequency of each tuner substantially depends upon the inductance value of its central conductor and the capacitance value of its variable capacitor. Further, the rear plate 1*d* and the front plate 1*c* have centrally disposed apertures 11*a* and 11*b* respectively, through which, for instance, an input lead wire 12*a* and an output lead wire 12*b* are inserted into the casing 1 and hence are bent, as depicted, to form loops 13*a* and 13*b* coupled to the central conductors 4*a* and 4*b* respectively, while the respective free ends of the wires being connected to the interior of the rear plate 1*d* and the front plate 1*c*.

In this invention the central condutcors 4*a* and 4*b* are bent in the form of an L and their ends to be grounded are connected to the partition wall 2 at opposing points 14*a* and 14*b* adjacent, for example, the right side plate 1*f*, causing the partition wall portion 2*a* (in FIG. 3) between the connecting points 14*a*, 14*b* and the casing 1 to function as a coupling inductance element. For this purpose, a narrow slit or aperture 15 is provided between the partition wall portion 2*a* and the casing 1. The slit or aperture 15 is selected to be small in area and is not of the type through which the two tuners 10*a* and 10*b* produce capacitive coupling as in the prior art tuner device of this kind. That is, the aperture 15 serves to cause the partition wall portion 2*a* between the connecting points 14*a*, 14*b* and the casing 1 to present an inductance with respect to a working frequency of, for instance, the UHF band. In the example illustrated in FIG. 3, a narrow slit is formed in the partition wall adjacent the right side of the casing 1 in the form of a "C," providing the partition wall portion 2*a* in spaced relation to the partition wall 2, and the connecting points 14*a* and 14*b* are located on the left marginal edge of the partition wall portion 2*a*. However, the slit may be formed in a manner so that the partition wall portion 2*a* and the partition wall 2 are contiguous to each other as in examples described later on.

It is desired in practice to adjust the inductance of the partition wall portion 2*a*. To this end, an additional slit 2*b* is formed which is contiguous to the slit 15 and a conductive plate 20 covering the slit 2*b* is designed to be slidably moved on the partition wall portion 2*a*. In order to move the conductive plate 20 from the outside of the casing 1, one end of a rod 21 is secured to the conductive plate 20 and its free end is projected outside of the casing 1 through an aperture 22 bored in the wall of the casing 1. By moving the conductive plate 20 with such a rod 21, the area of the partition wall 2*a* is changed at will so as to adjust the inductance coupling coefficient of the partition wall portion 2*a*. After a predetermined adjustment of the inductance coupling coefficient of the partition wall portion 2*a* the rod 21 is fixed to the casing 1 by means of soldering or other adhesives as indicated at 23, thus maintaining the inductance coupling at a predetermined value. This remarkedly facilitates manufacturing of the tuner devices, since adjustment of the inductance coupling coefficient can be effected easily and rapidly without necessity of precisely constructing the partition wall portion 2*a* of such an area and shape as predetermined from the very beginning of the manufacturing operations.

Figure 3:
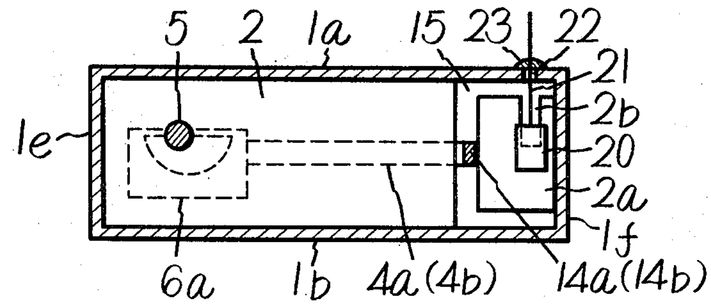
FIG. 3 is a cross-sectional view taken along the line B—B in FIG. 1.
Figure 4:
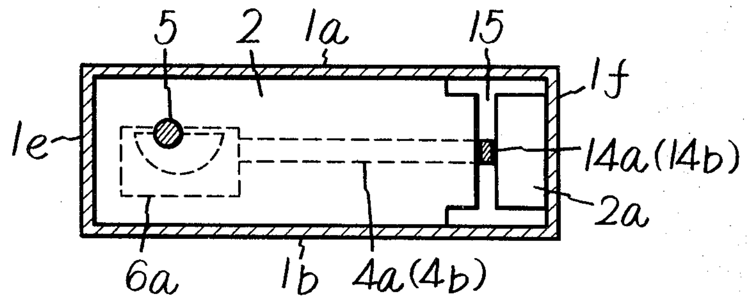

FIG. 4 illustrates a modified form of the principal part depicted in FIG. 3, in which the connecting points 14*a* and 14*b* are located on both the partition wall 2 and the partition wall portion 2*a* across the slit.

In FIG. 5 there is illustrated another modification of the principal part of the tuner device, in which the partition wall 2 and the partition wall portion 2*a* are almost continuous to each other and narrow slits 15*a* and 15*b* are respectively provided in the partition wall portion 2*a* along the portions adjoining the top and bottom plates 1*a* and 1*b* of the casing 1, as illustrated in the figures. That is, the upper and lower marginal portions of the partition wall 2 are slightly cut off a length corresponding to the sum of $(d_1+d_0+d_2)$, $d_1$ being the distance on the side of the left side plate 1*e* from the connecting point 14*a* or 14*b*, $d_0$ the thickness of the central conductors 4*a* and 4*b* and $d_1$ the distance on the side of the right side plate 1*f* from the connecting point 14*a* or 14*b*.

In such a case the connecting points 14*a* and 14*b* are not at zero potential or the potential of the casing 1, and the portion 2*a* of the partition wall 2 having formed therein slits 15*a* and 15*b* functions as an inductance element and consequently the central conductors 4*a* and 4*b* are connected to the casing 1 through an inductance element $\mathbf{l}_1$ between the connecting point 14*a* or 14*b* to the bottom plate 1*b* or an inductance element $\mathbf{l}_2$ between the connecting point 14*a* or 14*b* to the right side plate 1*f*. As a result of this, the tuner device described above becomes equivalent to a circuit such as shown in FIG. 7, which consists of a parallel tuning circuit 10*a* of an inductance element $L_1$ of the central conductor 4*a* and a variable capacitance element $C_1$ of the variable capacitor 6*a*, another parallel tuning circuit 10*b* of an inductance element $L_2$ of the central conductor 4*b* and a variable capacitance element $C_2$ of the variable capacitors 6*b* and a parallel connection of the inductance elements $\mathbf{l}_1$ and $\mathbf{l}_2$ which is inserted between the connection point 16 of the inductance elements $L_1$ and $L_2$ and the connection point 17 of the variable capacitance elements $C_1$ and $C_2$. Thus, the tuning circuits 10*a* and 10*b* are coupled with each other through the inductance elements $\mathbf{l}_1$ and $\mathbf{l}_2$. In order to set the coupling between the tuning circuits 10*a* and 10*b* at a predetermined value, it is sufficient to select suitably the inductance values of the inductance elements $\mathbf{l}_1$ and $\mathbf{l}_2$. The inductance values of the inductance elements $\mathbf{l}_1$ and $\mathbf{l}_2$ depend upon the characteristic impedance of the portion 2*a* having formed therein the slits 15*a* and 15*b* and the distances $d_1$ and $d_2$. In our experiment in which the thickness $d_0$ and the width $d_0'$ of the central conductors 4*a* and 4*b* are selected to be 0.5 mm. and 1.5 mm. and the partition wall 2 is cut off 1 mm. wide and 7 mm. long at the upper and lower marginal edges and $d_1=d_2=3.5$ mm., coupling in the band of 15 mc. could be obtained at 600 mc. Further, the provision of the conductor covering the slits 15*a* and 15*b* such as above described with FIG. 3, enables the area or shape of the partition wall portion 2*a* to be changed suitably, so that the inductance values of the inductance elements $\mathbf{l}_1$ and $\mathbf{l}_2$ can be made variable in the circuit depicted in FIG. 7. In the example shown in FIG. 5 or those in FIGS. 3 and 4, the two cavities 3*a* and 3*b* are interconnected through the slits 15*a* and 15*b*, but the slits 15*a* and 15*b* are very small in area and hence their functioning as coupling windows can be neglected.

FIG. 6 illustrates another embodiment of this invention, in which the slits 15*a* and 15*b* are formed in the partition wall 2, the length of each slit corresponding to the sum of the distances $d_1$ and $d_2$ on one side and the other side of the connecting points 14*a* and 14*b* of the central conductors 4*a* and 4*b*. Also in this example, the connecting points 14*a* and 14*b* of the central conductors 4*a* and 4*b* are not at zero potential or at the potential of the casing 1 as in the foregoing example and the portion of the partition wall 2 having formed therein the slits 15*a* and 15*b* performs the function of an inductance element. Namely, the free ends of the central conductors 4*a* and 4*b* are connected to the casing 1 through the inductance elements $\mathbf{l}_1$ and $\mathbf{l}_2$ corresponding to the distance $d_1$ and $d_2$ on the partition wall 2 and hence grounded. Accordingly, the above-described tuner device is electrically equivalent to a circuit such as shown in FIG. 8 which consists of a parallel circuit 10*a* of an inductance $L_1$ of the central conductor 4*a* and a capacitance $C_1$ of the capacitor 6*a*, another parallel circuit 10*b* of an inductance $L_2$ of the central conductor 4*b* and a capacitance $C_2$ of the capacitor 5*b* and a parallel connection of the inductance elements $\mathbf{l}_1$ and $\mathbf{l}_2$. The inductances $L_1$ and $L_2$ are connected to each other and the capacitances $C_1$ and $C_2$ are also connected to each other, while the parallel connection of the inductance elements $\mathbf{l}_1$ and $\mathbf{l}_2$ being connected between the connecting point 16 of the inductance elements $L_1$ and $L_2$ and the connecting point 17 of the capacitances $C_1$ and $C_2$. Thus, the both tuning circuits 10*a* and 10*b* are interconnected through the inductance elements $\mathbf{l}_1$ and $\mathbf{l}_2$. In order to change the coupling degree of the tuning circuits 10*a* and 10*b* as desired, it is sufficient to design the circuit shown in FIG. 8 such that the inductance value of the inductance element $\mathbf{l}_1$ or $\mathbf{l}_2$ can be changed at will.

For this purpose, a slit 15*c* is formed in the inductance element $\mathbf{l}_1$ or $\mathbf{l}_2$ substantially vertically to the current path therethrough as shown in FIG. 3. This causes an increase in the impedance of the portion of the partition wall portion corresponding to the distance $d_1$. By suitably covering the slit 15*c* with a conductive member 20, the circuit becomes equivalent to that depicted in FIG. 8 in which the inductance element $\mathbf{l}_1$ or $\mathbf{l}_2$ has been made variable, and consequently the circuit is equivalent to that shown in FIG. 9. That is, the impedance or the inductance of the portion of the partition wall portion corresponding to the distance $d_1$ is varied to a desired value to change the coupling degree of the circuits 10*a* and 10*b*, and therefore adjustment of the bandwith can accomplished. Further, fine adjustment of the inductance can readily be effected by the employment of a screw as the conductive member 20.

Reference character $k$ in FIGS. 7 to 9 indicates the coupling coefficient between the inductances $L_1$ and $L_2$.

In accordance with this invention, one portion of the partition wall 2 between the variable tuners 10_a_ and 10_b_ is utilized as a coupling inductance element and the variable tuners 10_a_ and 10_b_ are coupled through the coupling inductance element, as has been described in the foregoing. Further, since one portion of the partition wall 2 is used as the coupling inductance element, coupling of the variable tuners 10_a_ and 10_b_ can be made extremely loose. Therefore, this invention is suitable for use in a tuner device which is employed in the case where the fractional band width is narrow as in the television signals of the UHF band and loose coupling is required.

It will be apparent that many modifications and variations may be effected without departing from the scope of the novel concepts of this invention.

What we claim is:

1. In a tuner device having a conductive casing, a partition wall electrically connected to said conductive casing for partitioning said conductive casing into a plurality of cavities, and a plurality of variable capacitance elements, one said element located in each of said plurality of cavities, said conductive casing and said partition wall being grounded, the improvement comprising:

said partition wall having means forming a pair of slits therein located along opposite marginal edges of said partition wall at one end portion thereof for providing electrical potential with respect to the ground level at said one end portion, and a conductor extending parallel to said slits and having one end thereof connected to each of said plurality of variable capacitance elements and an opposite end thereof connected to said partition wall at said one end portion where said partition wall has electrical potential with respect to the ground level, whereby inductive coupling is effectively obtained between adjacent cavities.

2. A tuner device as claimed in claim 1 further characterized by another slit formed contiguous to one of said pair of slits and approximately at right angles thereto, and a conductive plate slidably covering said contiguously formed slit to change the effective area of said one end portion of said partition wall.

References Cited

UNITED STATES PATENTS

| | | | |
|---|---|---|---|
| 2,432,093 | 12/1947 | Fox | 333—83 XR |
| 2,763,783 | 9/1956 | Lorenzen | 333—82 XR |
| 2,798,945 | 7/1957 | Hinsdale | 333—76 XR |
| 2,819,391 | 1/1958 | Reiches | 334—43 XR |
| 3,074,035 | 1/1963 | Pakan | 333—73 |

HERMAN KARL SAALBACH, Primary Examiner

M. NUSSBAUM, Assistant Examiner

U.S. Cl. X.R.

334—83, 85